(12) United States Patent
Zingher

(10) Patent No.: US 9,748,414 B2
(45) Date of Patent: Aug. 29, 2017

(54) SELF-ACTIVATED FRONT SURFACE BIAS FOR A SOLAR CELL

(76) Inventor: Arthur R. Zingher, Mountain View, CA (US)

( * ) Notice: Subject to any disclaimer, the term of this patent is extended or adjusted under 35 U.S.C. 154(b) by 1136 days.

(21) Appl. No.: 13/476,955

(22) Filed: May 21, 2012

(65) Prior Publication Data

US 2013/0125950 A1    May 23, 2013

Related U.S. Application Data

(60) Provisional application No. 61/488,668, filed on May 20, 2011.

(51) Int. Cl.
| | | |
|---|---|---|
| *H01L 31/05* | (2014.01) | |
| *H01L 31/068* | (2012.01) | |
| *H01L 31/02* | (2006.01) | |
| *H01L 31/042* | (2014.01) | |

(52) U.S. Cl.
CPC ...... *H01L 31/02021* (2013.01); *H01L 31/042* (2013.01); *H01L 31/05* (2013.01); *H01L 31/0682* (2013.01); *Y02E 10/547* (2013.01)

(58) Field of Classification Search
None
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,430,519 A | 2/1984 | Young |
| 4,461,922 A | 7/1984 | Gay et al. |
| 4,479,847 A | 10/1984 | McCaldin et al. |
| 4,626,613 A | 12/1986 | Wenham et al. |
| 4,661,212 A | 4/1987 | Ehrfeld et al. |
| 4,672,023 A | 6/1987 | Leung |
| 4,922,277 A | 5/1990 | Carlson |

(Continued)

FOREIGN PATENT DOCUMENTS

| | | |
|---|---|---|
| DE | 41 41 083 A1 | 6/1993 |
| EP | 0 334 330 A2 | 9/1989 |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Magali P Slawski
(74) *Attorney, Agent, or Firm* — Howard IP Law Group, PC.

(57) ABSTRACT

A self-activated front surface bias for photovoltaic solar cell assembly is provided. The solar cell assembly comprises a front surface electrical bias activated by electrical energy generated by the solar cell assembly. The front surface bias improves generation efficiency for said solar cell assembly.

7 Claims, 8 Drawing Sheets

(56) References Cited

U.S. PATENT DOCUMENTS

| | | | |
|---|---|---|---|
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |
| 5,215,599 A | 6/1993 | Hingorani et al. | |
| 5,248,621 A | 9/1993 | Sano | |
| 5,316,593 A | 5/1994 | Olson et al. | |
| 5,348,618 A | 9/1994 | Canham et al. | |
| 5,397,400 A | 3/1995 | Matsuno et al. | |
| 5,458,755 A | 10/1995 | Fujiyama et al. | |
| 5,459,099 A | 10/1995 | Hsu | |
| 5,494,832 A | 2/1996 | Lehmann et al. | |
| 5,538,564 A | 7/1996 | Kaschmitter | |
| 5,616,185 A | 4/1997 | Kukulka | |
| 5,645,684 A | 7/1997 | Keller | |
| 5,660,680 A | 8/1997 | Keller | |
| 5,681,392 A | 10/1997 | Swain | |
| 5,704,992 A | 1/1998 | Willeke et al. | |
| 5,882,988 A | 3/1999 | Haberern et al. | |
| 5,899,360 A | 5/1999 | Mack et al. | |
| 5,928,438 A | 7/1999 | Salami | |
| 5,994,640 A | 11/1999 | Bansemir et al. | |
| 6,058,945 A | 5/2000 | Fujiyama et al. | |
| 6,081,017 A * | 6/2000 | Kim | H01L 31/022425 136/252 |
| 6,091,021 A | 7/2000 | Ruby | |
| 6,096,229 A | 8/2000 | Shahid | |
| 6,114,046 A | 9/2000 | Hanoka | |
| 6,127,623 A | 10/2000 | Nakamura et al. | |
| 6,143,629 A | 11/2000 | Sato | |
| 6,204,443 B1 | 3/2001 | Kiso et al. | |
| 6,225,193 B1 | 5/2001 | Simpson et al. | |
| 6,294,725 B1 | 9/2001 | Hirschberg et al. | |
| 6,331,208 B1 | 12/2001 | Nishida et al. | |
| 6,399,143 B1 | 6/2002 | Sun | |
| 6,416,647 B1 | 7/2002 | Dordi et al. | |
| 6,428,620 B1 | 8/2002 | Yamagata et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,524,880 B2 | 2/2003 | Moon et al. | |
| 6,534,336 B1 | 3/2003 | Iwane et al. | |
| 6,551,908 B2 | 4/2003 | Ukiyo et al. | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2 | 11/2003 | Brendel | |
| 6,649,485 B2 | 11/2003 | Solanki et al. | |
| 6,653,722 B2 | 11/2003 | Blalock | |
| 6,664,169 B1 | 12/2003 | Iwasaki et al. | |
| 6,756,289 B1 | 6/2004 | Nakagawa et al. | |
| 6,818,104 B2 | 11/2004 | Iwasake et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,014,748 B2 | 3/2006 | Matsumura et al. | |
| 7,022,585 B2 | 4/2006 | Solanki et al. | |
| 7,026,237 B2 | 4/2006 | Lamb | |
| 7,309,658 B2 | 12/2007 | Lazovsky et al. | |
| 7,368,756 B2 | 5/2008 | Bruhns et al. | |
| 7,402,523 B2 | 7/2008 | Nishimura | |
| 7,745,313 B2 | 6/2010 | Wang et al. | |
| 7,786,376 B2 | 8/2010 | Nag et al. | |
| 7,999,174 B2 | 8/2011 | Moslehi et al. | |
| 8,035,027 B2 | 10/2011 | Moslehi et al. | |
| 8,035,028 B2 | 10/2011 | Moslehi et al. | |
| 8,053,665 B2 | 11/2011 | Moslehi et al. | |
| 8,084,684 B2 | 12/2011 | Moslehi et al. | |
| 8,129,822 B2 | 3/2012 | Moslehi et al. | |
| 8,168,465 B2 | 5/2012 | Wang et al. | |
| 8,193,076 B2 | 6/2012 | Moslehi et al. | |
| 8,241,940 B2 | 8/2012 | Moslehi et al. | |
| 2002/0079290 A1 | 6/2002 | Holdermann | |
| 2002/0153039 A1 | 10/2002 | Moon et al. | |
| 2002/0168592 A1 | 11/2002 | Vezenov | |
| 2002/0179140 A1 | 12/2002 | Toyomura | |
| 2003/0017712 A1 | 1/2003 | Brendel | |
| 2003/0039843 A1 | 2/2003 | Johnson | |
| 2003/0124761 A1 | 7/2003 | Baert | |
| 2004/0021062 A1 | 2/2004 | Zaidi | |
| 2004/0028875 A1 | 2/2004 | Van Rijn | |
| 2004/0173790 A1 | 9/2004 | Yeo | |
| 2004/0175893 A1 | 9/2004 | Vatus et al. | |
| 2004/0192044 A1 | 9/2004 | Degertekin et al. | |
| 2004/0235406 A1 | 11/2004 | Duescher | |
| 2004/0257155 A1 * | 12/2004 | McEwen | H03F 1/303 330/59 |
| 2004/0259335 A1 | 12/2004 | Narayanan | |
| 2004/0265587 A1 | 12/2004 | Koyanagi | |
| 2005/0160970 A1 | 7/2005 | Niira | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0199279 A1 | 9/2005 | Yoshimine et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0042681 A1 * | 3/2006 | Korman | H01L 31/052 136/251 |
| 2006/0043495 A1 | 3/2006 | Uno | |
| 2006/0054212 A1 | 3/2006 | Fraas et al. | |
| 2006/0070884 A1 | 4/2006 | Momoi et al. | |
| 2006/0105492 A1 | 5/2006 | Veres et al. | |
| 2006/0177988 A1 | 8/2006 | Shea et al. | |
| 2006/0196536 A1 | 9/2006 | Fujioka | |
| 2006/0219291 A1 * | 10/2006 | Hikosaka | H02S 30/10 136/251 |
| 2006/0231031 A1 | 10/2006 | Dings et al. | |
| 2006/0266916 A1 | 11/2006 | Miller et al. | |
| 2006/0270179 A1 | 11/2006 | Yang | |
| 2006/0283495 A1 | 12/2006 | Gibson | |
| 2006/0286775 A1 | 12/2006 | Singh et al. | |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0128641 A1 | 6/2008 | Henley et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2008/0314432 A1 * | 12/2008 | Paulson | H01L 31/0443 136/244 |
| 2009/0032093 A1 | 2/2009 | Fang | |
| 2009/0042320 A1 | 2/2009 | Wang et al. | |
| 2009/0107545 A1 | 4/2009 | Moslehi | |
| 2009/0151784 A1 | 6/2009 | Luan et al. | |
| 2009/0199901 A1 | 8/2009 | Trassl et al. | |
| 2009/0260685 A1 | 10/2009 | Lee et al. | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |
| 2010/0126550 A1 * | 5/2010 | Foss | G05F 1/67 136/244 |
| 2010/0144080 A1 | 6/2010 | Ong | |
| 2010/0148318 A1 | 6/2010 | Wang et al. | |
| 2010/0148319 A1 | 6/2010 | Wang et al. | |
| 2010/0154998 A1 | 6/2010 | Ong | |
| 2010/0175752 A1 | 7/2010 | Wang et al. | |
| 2010/0203711 A1 | 8/2010 | Wang et al. | |
| 2010/0206359 A1 | 8/2010 | Evans | |
| 2010/0267186 A1 | 10/2010 | Wang et al. | |
| 2010/0267245 A1 | 10/2010 | Kamian et al. | |
| 2010/0279494 A1 | 11/2010 | Wang et al. | |
| 2010/0294333 A1 | 11/2010 | Wang et al. | |
| 2010/0294356 A1 | 11/2010 | Parikh et al. | |
| 2010/0300518 A1 | 12/2010 | Moslehi et al. | |
| 2010/0304521 A1 | 12/2010 | Seutter et al. | |
| 2010/0304522 A1 | 12/2010 | Rana et al. | |
| 2011/0014742 A1 | 1/2011 | Parikh et al. | |

(56) References Cited

U.S. PATENT DOCUMENTS

| | | |
|---|---|---|
| 2011/0030610 A1 | 2/2011 | Kamian et al. |
| 2011/0108098 A1 | 5/2011 | Kapur et al. |
| 2011/0120882 A1 | 5/2011 | Crafts et al. |
| 2011/0124145 A1 | 5/2011 | Moslehi et al. |
| 2011/0265867 A1 | 11/2011 | Moslehi et al. |
| 2011/0272013 A1 | 11/2011 | Moslehi et al. |
| 2011/0284068 A1 | 11/2011 | Moslehi et al. |
| 2012/0012160 A1 | 1/2012 | Moslehi et al. |
| 2012/0017971 A1 | 1/2012 | Moslehi et al. |
| 2012/0017988 A1 | 1/2012 | Moslehi et al. |
| 2012/0021560 A1 | 1/2012 | Moslehi et al. |
| 2012/0028399 A1 | 2/2012 | Moslehi et al. |
| 2012/0085278 A1 | 4/2012 | Moslehi et al. |
| 2012/0103408 A1 | 5/2012 | Moslehi et al. |
| 2012/0122272 A1 | 5/2012 | Rana et al. |
| 2012/0125256 A1 | 5/2012 | Kramer et al. |
| 2012/0145553 A1 | 6/2012 | Kramer et al. |
| 2012/0167819 A1 | 7/2012 | Kramer et al. |
| 2012/0171804 A1 | 7/2012 | Moslehi et al. |
| 2012/0174860 A1 | 7/2012 | Moslehi et al. |
| 2012/0174861 A1 | 7/2012 | Wang et al. |
| 2012/0178203 A1 | 7/2012 | Moslehi et al. |
| 2012/0180867 A1 | 7/2012 | Moslehi et al. |
| 2012/0192789 A1 | 8/2012 | Kramer et al. |
| 2012/0225515 A1 | 9/2012 | Moslehi et al. |

FOREIGN PATENT DOCUMENTS

| | | |
|---|---|---|
| EP | 1 024 523 A1 | 2/2000 |
| EP | 1 054 458 A2 | 11/2000 |
| JP | 06-260670 A | 9/1994 |
| JP | 2002-299661 A | 10/2002 |
| JP | 2006-066550 A | 3/2006 |
| KR | 10-0257628 | 6/2000 |
| WO | WO 96/41368 | 12/1996 |
| WO | PCT/EP1999/008573 | 5/2000 |
| WO | WO/2006/096247 | 9/2006 |
| WO | WO/2012/162268 | 11/2012 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

R.B. Bergmann, Crystalline Si Thin-Film Solar Cells: a Review, 1999, pp. 187-194, vol. 69, Applied Physics A Materials Science and Processing, Springer-Verlag.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

PCT International Search Report and Written Opinion dated May 27, 2013 issued in PCT/US2012/038895.

(56) References Cited

OTHER PUBLICATIONS

PCT International Preliminary Report on Patentability dated Nov. 20, 2013 issued in PCT/US2012/038895.

* cited by examiner

SELF-ACTIVATED FRONT SURFACE BIAS FOR A SOLAR CELL

CROSS-REFERENCE TO RELATED APPLICATIONS

This application claims the benefit of provisional patent application 61/488,668 filed on May 20,2011, which is hereby incorporated by reference in its entirety.

FIELD

This disclosure relates in general to the field of solar photovoltaics, and more particularly to electrical connections and conversion efficiency enhancement for back contact solar cells.

BACKGROUND

Consider a solar cell (SC) wherein most of the front surface (FS)—the solar cell side receiving sunlight, also called the sunny surface or sunnyside—is NOT directly connected to an emitter or base. In one known SC design, the SC has contacts and wires for emitters and bases near or on the back surface (BS)—also called the shady surface, non-sunnyside, or backside. In another known solar cell design, the solar cell has the base contact on the back surface and emitter contacts that penetrate ("wraps through") the solar cells.

Solar cells often suffer from wasted energy near the front surface. For short wavelength light on a crystalline silicon solar cell, light absorption and generation of electrons and holes (electron-hole pairs) occurs very close to the front surface. In this region, if there are any electronic traps or recombination centers, the energy in electrons or holes may be absorbed and degraded into heat and thus wasted. Depending on details of solar cell fabrication and passivation, it may be difficult to sufficiently minimize such traps and recombination centers.

Solar cells also often suffer from uneven illumination. Consider a number of solar cells connected in series and one solar cell is shaded but the other connected solar cells are brightly illuminated. In this case, the illuminated solar cells will generate much more power than the shaded solar cell. Therefore, power is generated by the illuminated solar cells and is dissipated in the shaded solar cell. This may cause the shaded SC to become very hot and suffer permanent damage. One solution to this problem is to provide a bypass diode in parallel with a solar cell or in parallel with a series string of solar cells.

Known solutions for solar cell front surface degradation include a solar cell with a bias voltage or charge on a transparent conductive layer (or "gate") on the sunny surface of the solar cell to minimize recombination. Another known solution includes a gate on the sunny surface of the solar cell to minimize recombination.

Known solutions to the problems above, front surface degradation and unequal illumination, are very separate. In other words, the solutions for one problem do NOT provide solutions to the other.

SUMMARY

Therefore a need has arisen for solar cell assembly which provides a solution to front surface degradation. In accordance with the disclosed subject matter, solar cell assembly is provided which substantially eliminates or reduces disadvantages associated with previously developed solar cell assemblies.

According to one aspect of the disclosed subject matter, a self-activated front surface bias for photovoltaic solar cell assembly is provided. The solar cell assembly comprises a front surface bias activated by energy generated by the solar cell assembly. The front surface bias improves generation efficiency for said solar cell assembly.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages that are included within this description, be within the scope of any claims filed later.

BRIEF DESCRIPTION OF THE DRAWINGS

The features, natures, and advantages of the disclosed subject matter may become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1A:
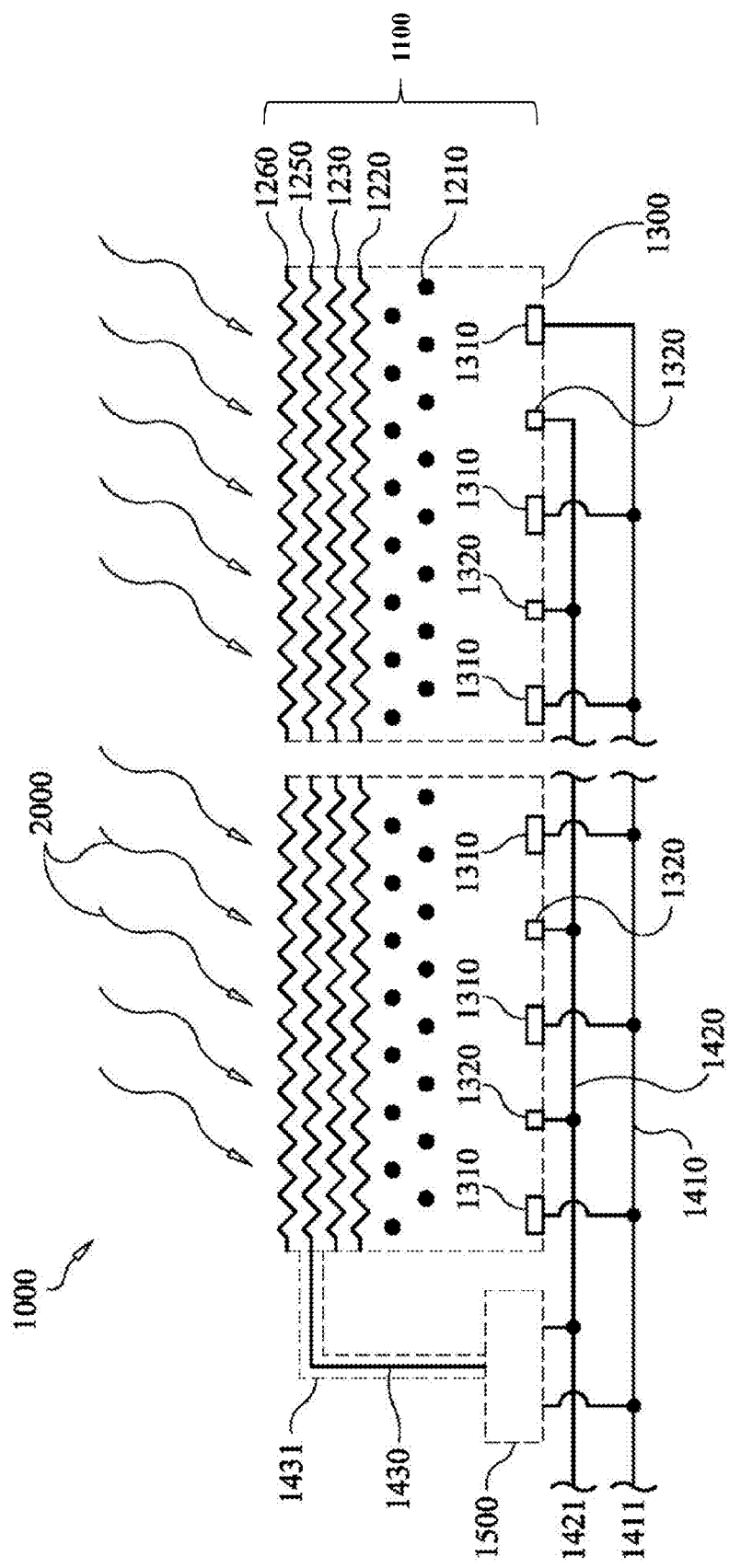
FIG. 1A is a diagram depicting overall a solar cell assembly in accordance with the disclosed subject matter.

The following description is not to be taken in a limiting sense, but is made for the purpose of describing the general principles of the present disclosure. The scope of the present disclosure should be determined with reference to the claims. And although described with reference to a back contact back junction solar cell a person skilled in the art could apply the principles discussed herein to various solar cell designs.

Preferred embodiments of the present disclosure are illustrated in the drawings, like numbers being used to refer to like and corresponding parts of the various drawings.

In a solar cell, if an electron and hole (produced by an incident solar photon) recombine at the solar cell front surface then their energy will be wasted. The disclosed subject matter provides a solution to prevent this waste by utilizing a front-surface bias to improve photo-voltaic conversion efficiency by reducing the effective front surface recombination velocity. On the front surface, a bias voltage is applied which produces front surface charges with the same polarity as minority carriers. This causes an electrical field that pushes minority carriers away from the front surface which reduces the concentration of minority carriers and reduces recombination near the front surface—thus improving photovoltaic efficiency. For example, in a solar cell with n-type doping (or n-type base) holes are the minority carriers and a positive bias produces front surface positive charges that repel minority carriers, hence reducing the effective front surface recombination velocity.

FIG. 1A is a diagram depicting overall solar cell assembly 1000, including a semiconductor solar cell 1100. In the present disclosure, when the solar cell assembly operates, the front surface is illuminated by sunlight and the back surface is shaded. On the solar cell back surface are emitters 1310 and bases 1320 and corresponding contacts and wires 1410 and 1420 (wires 1410 and 1420 shown as discrete lines but are actually deposited on the solar cell back surface). Near the solar cell front surface are five layers: trapped charge layer 1210 (shown as dots in dispersed in the cell); texture layer 1220; passivation layer 1230; transparent conductive layer 1250; outer window layer 1260.

Transparent conductive layer 1250 may be a fully transparent or semi-transparent conductive layer—embodiments include a thin layer of Indium Tin Oxide, or Zinc oxide with Al doping, or a mesh of carbon nano-tubes, or a mesh of silver nanowires. Also, it may be feasible to use a graphene layer that is ultra-thin, transparent, and electro-conductive. Further, the inner window layer 1250 and/or outer window layer 1260 may be a transparent dielectric.

Figure 2A:
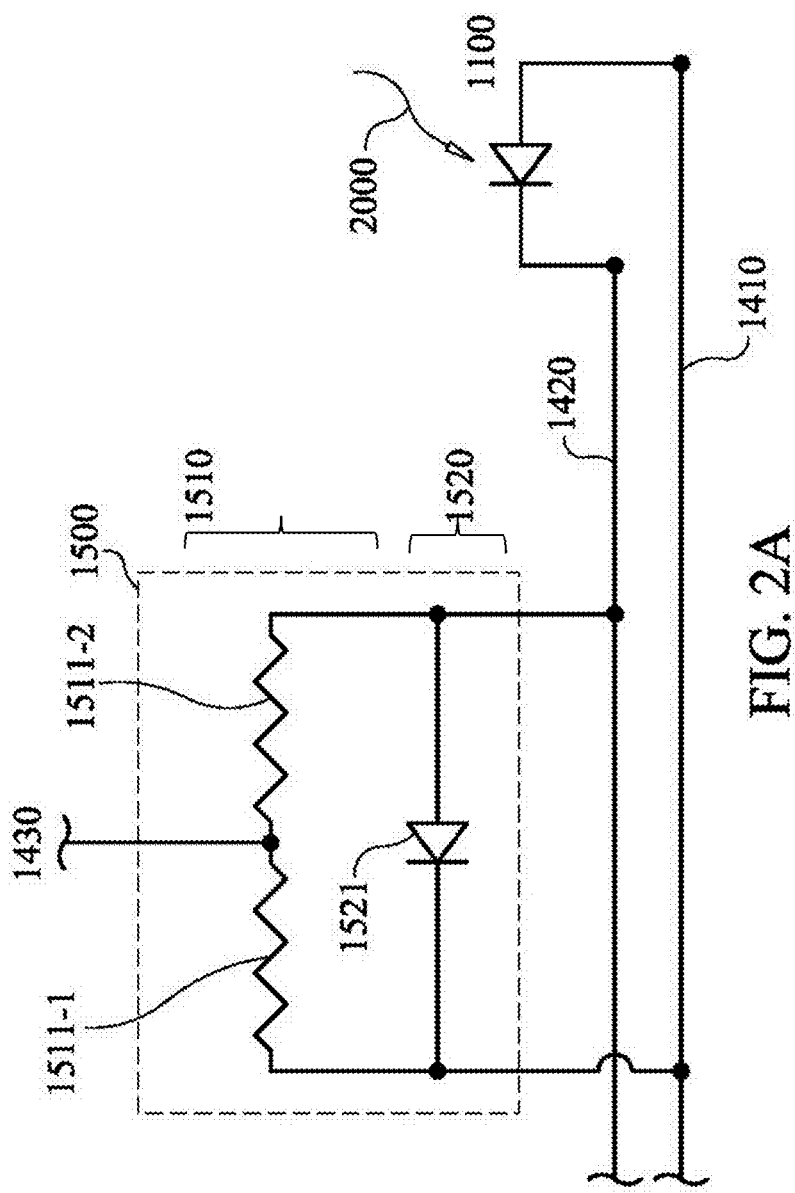
FIGS. 2A-2C are diagrams showing several embodiments of an integrated circuit in accordance with the disclosed subject matter.
Figure 2B:
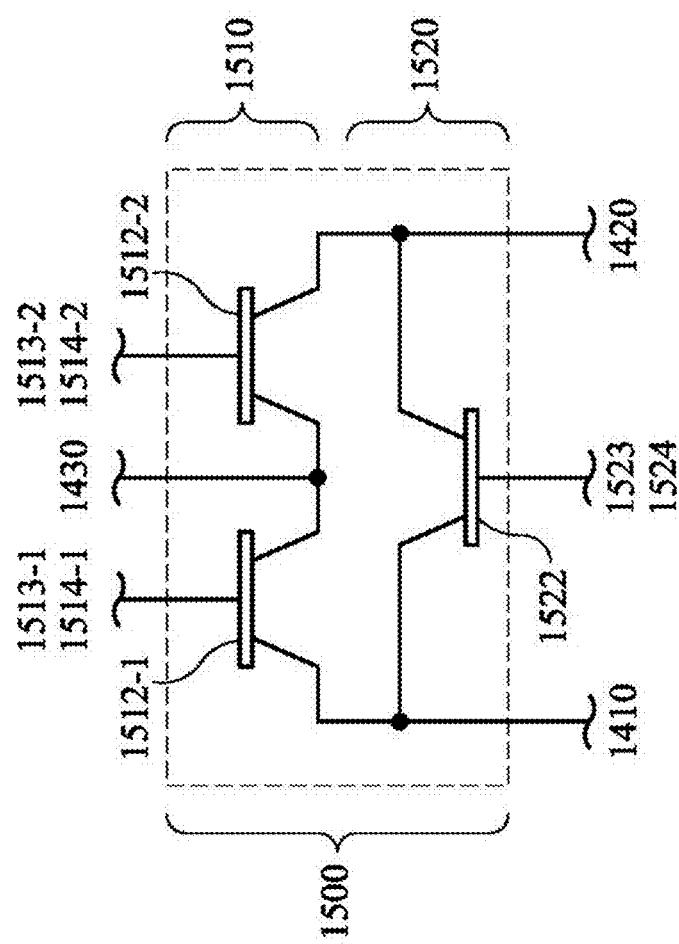

FIG. 1A shows integrated circuit chip 1500 (IC) that provides a bias circuit embodiments which are further depicted in FIGS. 2A-2B. IC 1500 has several connections: emitter wire 1410; emitter output wire 1411; base wire 1420; base output wire 1421; and bias wire 1430. In this embodiment, bias wire 1430 connects to transparent conductive layer 1250 on the front surface of the solar cell. This is surrounded by electrical insulation 1431. This embodiment provides ohmic coupling from transparent conductive layer 1250 to solar cell 1100. The transparent conductive layer 1250 may provide an ohmic connection between the bias circuit and the solar cell. In addition, the IC circuit may also include a bypass circuit, shown as 1520 in FIGS. 2A-2C. For example, a bypass diode, such as bypass diode 1521, may be connected between emitter and base wires. This protects the solar cell against possible resistive overheating when series connected solar cells are unequally illuminated.

FIG. 1A and all of the following figures (FIG. 1A-3B) combine several graphical styles. The structures and thin layers of solar cell 1100 are not drawn to scale but are exaggerated for descriptive purposes. Further, emitter wires 1410 and base wires 1420 are actually deposited on the back surface 1300 of the solar cell 1100 although these are drawn as discrete lines. Also, connections between wires are marked by dots—thus wire lines that cross without dots are not connected. And although not shown, gate control signals are provided by other circuits.

FIG. 1A shows an ohmic coupling between transparent conductive layer 1250 and solar cell 1100. Through bias wire 1430, this dissipates power equal to the current times bias voltage. It is desirable for this dissipated power to be small compared to the cell output power. By contrast, the embodiment shown in FIG. 1B has a capacitive coupling which on average has tiny current density and tiny dissipation.

Transparent conductive layer 1250 should be sufficiently transparent not to significantly attenuate the light that reaches the solar cell. For example, optical attenuation less than 2% is desirable. Further, there should be sufficient in-plane electrical conductivity so this layer is approximately at a uniform voltage. For example, the voltage difference across the plane over the cell area should preferably be less than 0.05 volts. Further, for an embodiment with capacitive coupling (such as FIG. 1B), the in-plane current and current density are very small thus a relatively small in-plane conductivity is sufficient.

Figure 1B:
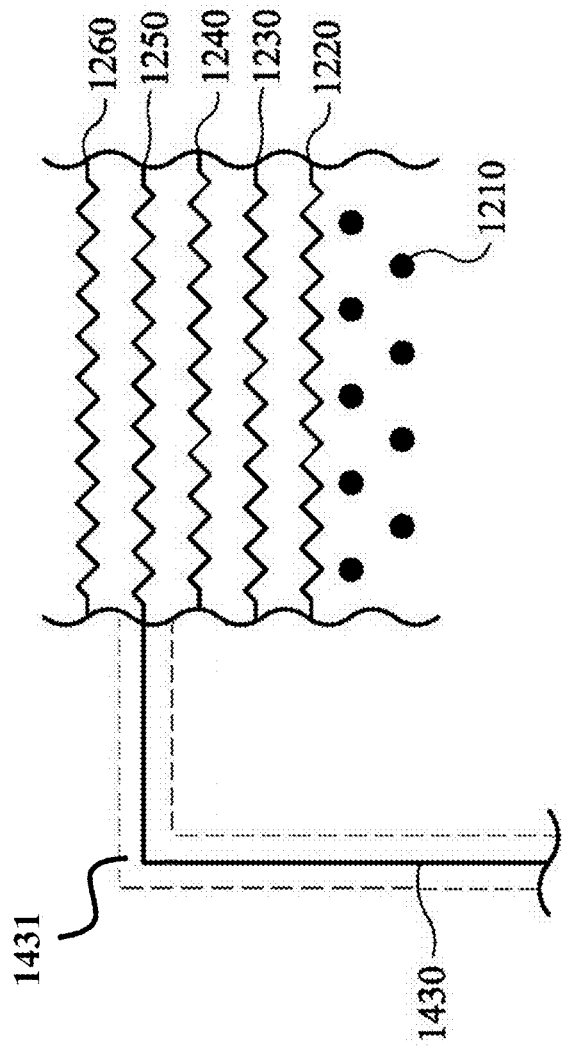
FIG. 1B is a diagram highlighting another embodiment of the solar cell front surface layers and the bias wire connection.

FIG. 1B is a diagram highlighting another embodiment of the solar cell front surface layers and the bias wire connection. In this embodiment, the layers are slightly different: trapped charge layer 1210; texture layer 1220; passivation layer 1230; dielectric inner window layer 1240; transparent conductive layer 1250; outer window layer 1260. In contrast with FIG. 1A, this shows capacitive coupling from transparent conductive layer 1250 through dielectric inner window layer 1240 to the solar cell 1100.

Figure 1C:
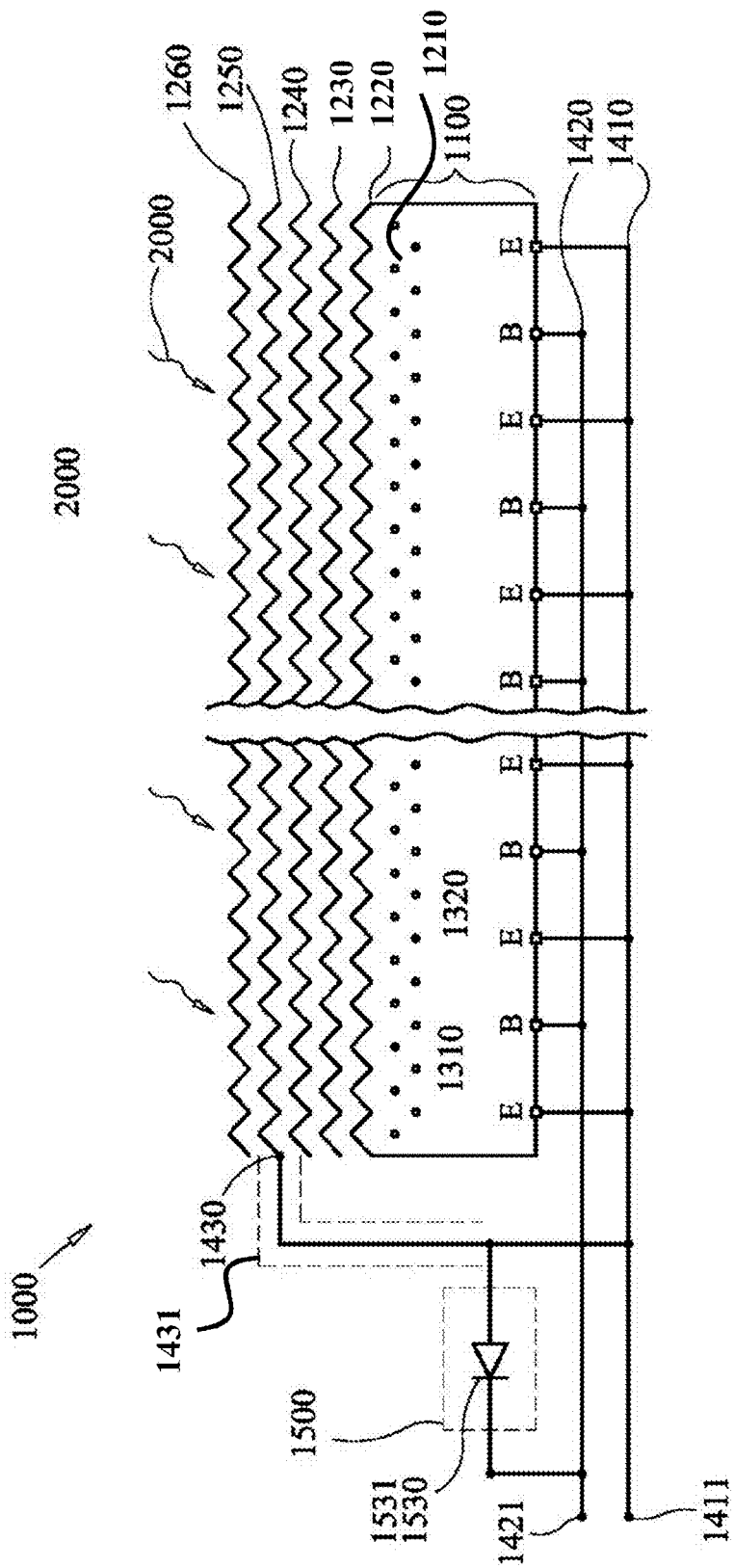
FIG. 1C is a diagram depicting another embodiment solar cell assembly embodiment in accordance with the disclosed subject matter.

FIG. 1C is a diagram depicting another embodiment overall solar cell solar cell assembly 1000, including a semiconductor solar cell 1100. Here, emitter wire 1410 is directly connected to bias wire 1430 and hence to transparent conductive layer 1250. Bypass protection circuit 1520 may be a conventional bypass diode 1521 connected between emitter wires 1410 and base wires 1420. Solar cell 1100 of FIG. 1C has a front surface with layers shown in FIG. 1B, including inner window layer 1240.

This solar cell assembly of FIG. 1C may have a lower cost because of lower fabrication cost and utilizing conventional assembly processes. In this IC design, bias wire 1430 may directly connect from the solar cell electrode (either emitter 1310 or base 1320) with the same polarity as minority carriers in the solar cell. This electrode wire, which may be either emitter wire 1410 or base wire 1420 depending on the polarity of the minority carriers in the solar cell, and bias wire directly feed the front surface transparent conductive layer 1250. In FIG. 1C, this is shown as the connection of bias wire 1430 to emitter wire 1410. The solar cell electrodes are connected to emitter wires 1410 and base wires 1420, which may be bus bars (for example flexible metal ribbons or printed circuits). Bias wire 1430 may be a distinct wire or an extension of the positive bus bar and the connections may use solder or an electro-conductive adhesive.

In one example, the solar cell semiconductor is n-type silicon and the base and emitter contacts (electrodes) and corresponding semiconductor junctions are all close to the back surface. This structure is sometimes described as "back contact and back junction" or BCBJ solar cell (also called interdigitated back contact or IBC). The emitters are the positive electrodes that connect to a positive bus bar which connects to a distinct bias wire that connects to the transparent conductive layer (the design diagramed in FIG. 1C). In a slightly different embodiment, the bias wire is a "through silicon via" or TSV. Similar vias are known in the design of semiconductor chips.

Figure 2C:
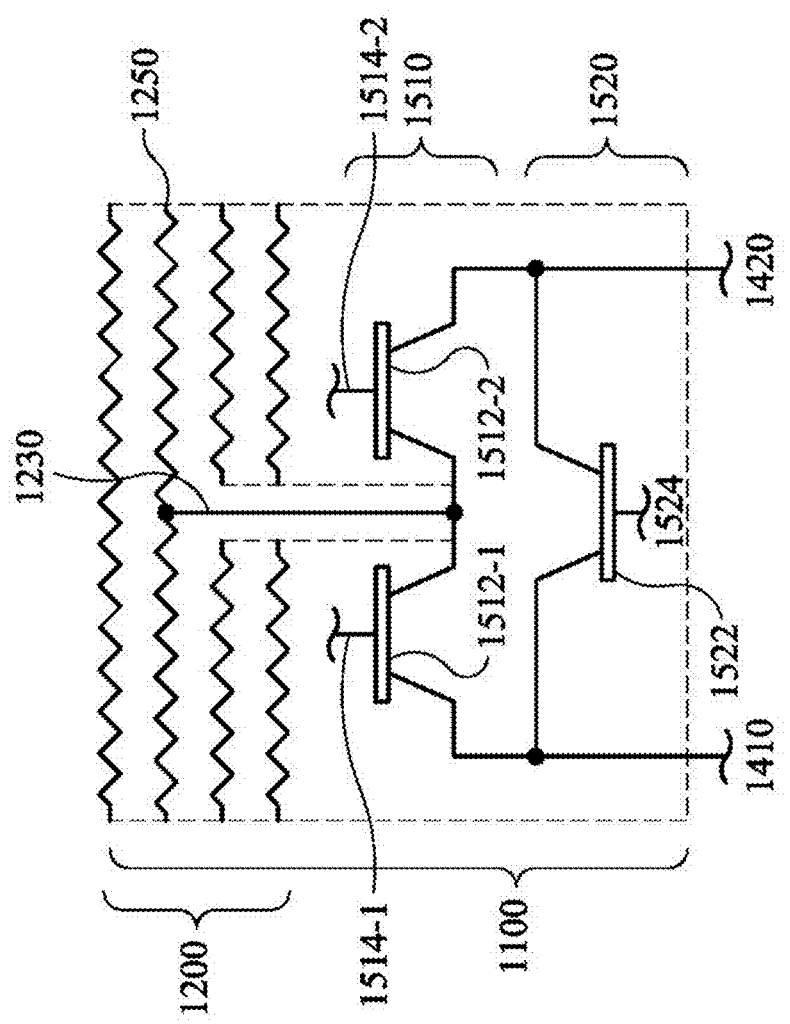

FIGS. 2A-2C are diagrams showing several embodiments of IC 1500. Each embodiment shown provides a bias circuit 1510 and a bypass circuit 1520.

In the integrated circuit embodiment of FIG. 2A, IC 1500, bias circuit 1510 is a voltage divider formed by two resistors, 1511-1 and 1511-2, connected between emitter wire 1410 and base wire 1420. Bias wire 1430 connects to the transparent conductor layer 1250 of the solar cell but is insulated from other parts of the cell. The bypass circuit 1520 is a diode 1521. In the IC design of FIG. 2A, the bypass circuit 1520 is a semiconductor diode 1521 designed for a small forward voltage drop at a large forward current.

In the integrated circuit embodiment of FIG. 2B, IC 1500, bias circuit 1510 is a voltage divider formed by two transistors, 1512-1 and 1512-2. The bypass circuit 1520 is a transistor 1522. Each transistor 1513-1, 1513-2, 1523 has a gate that connects to an individual control signal 1514-1, 1514-2, 1524 (not shown) that is also provided. In this embodiment, the bypass circuit 1520 includes a transistor(s) 1522 that is designed for high current with small voltage drop when its gate 1524 is turned on. IC chip 1500 is connected between the emitter 1410 and base wires 1420 and bias wire 1430 provides voltage tap that is connected to the front surface transparent conductive layer 1250. The control inputs into the transistor gates, 1514-1 and 1514-2, adjust the voltage division ratio and thus adjusts the bias voltage that is connected to the front surface transparent conductive layer 1250. These control inputs are driven by an analog input or by a digital input through a digital to analog converter.

The bias means and bypass means preferably are unified: share one tiny piece of semiconductor, its electronic "package", and its assembly into the solar cell assembly. If necessary, this can include an auxiliary component(s) for voltage step up. In high volume production, the cost and size are preferably only slightly more than those for the bypass protection alone.

In the integrated circuit embodiment of FIGS. 2A and 2B there is partial unification and significant synergism between the bias circuit 1510 and the bypass circuit 1520. Both circuits may be connected to the solar cell emitter wire 1410 and solar cell base wire 1420 and one integrated circuit may provide both bias and bypass circuits. Allowing both bias and bypass circuits to take advantage of electronic devices (wiring, resistor, diode, transistor, electronic "packaging") provided by the IC—thus lower manufacturing costs. Depending on costs, an IC with both circuits may be fabricated directly into the semiconductor of the solar cell (as shown in FIG. 2C). For example, both circuits may be fabricated in a tiny area near a corner of the back side 1300 of a crystalline silicon solar cell 1100.

Figure 3A:
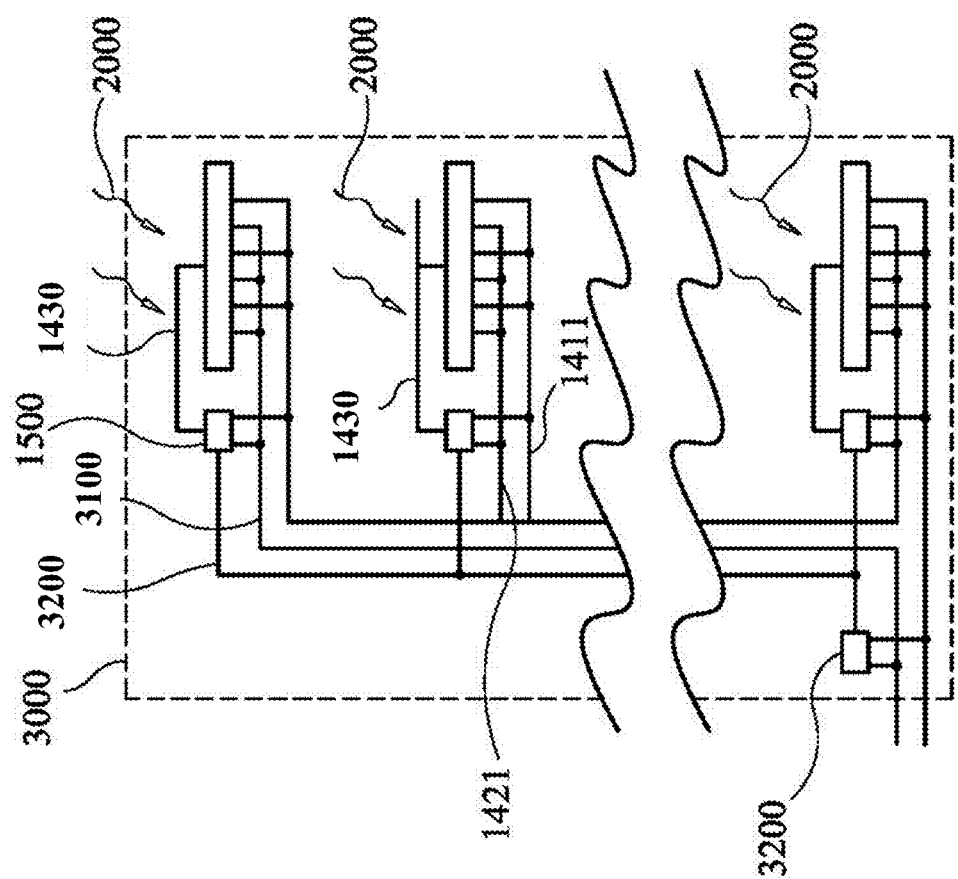
FIG. 3A is diagram depicting a panel level embodiment of disclosed subject matter.
Figure 3B:
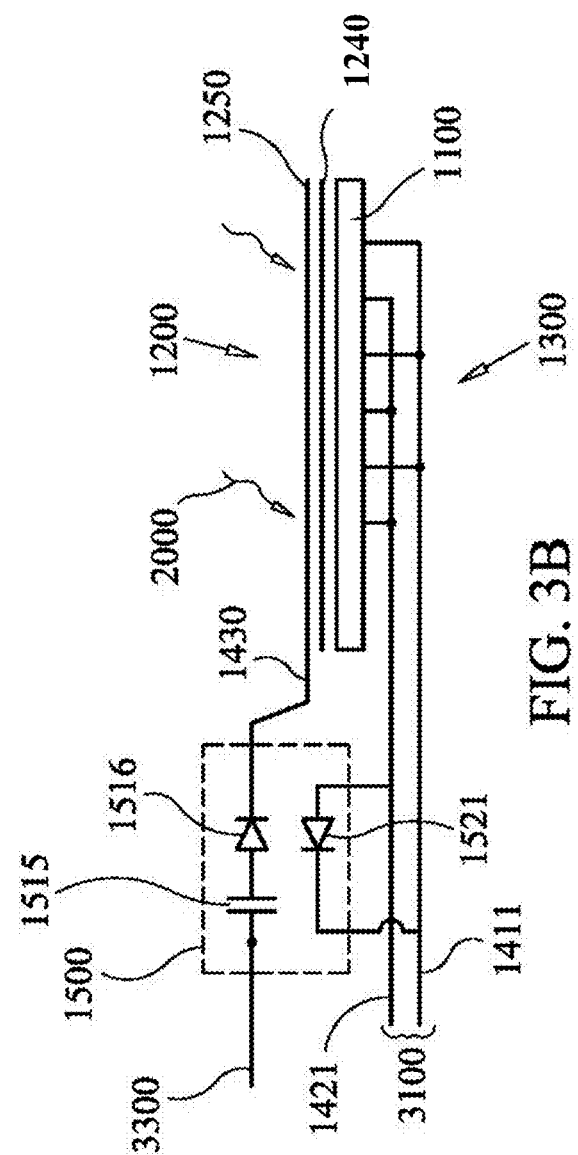
FIG. 3B is a diagram highlighting an integrated circuit embodiment and solar assembly design of FIG. 3A.

In another embodiment, one bias circuit provides bias to several solar cells (for example a solar panel as shown in FIG. 3A-3B). For example, several solar cells may be approximately equal in optimum bias and operating conditions. The former depends mainly on cell fabrication and the latter depends on the layout of the solar farm. If the solar cells are connected in series, each solar cell bias should be offset by a corresponding voltage—thus one bypass circuit may provide bypass protection for a string of solar cells.

In the integrated circuit embodiment of FIG. 2C, the IC of FIG. 2B is fabricated on a surface of the solar cell having the same front surface layer structure as that shown in FIG. 1A. For example, the IC may be positioned on a tiny area near a corner of the back surface of the solar cell. Bias wire 1430 connects from the bias circuit 1510 to front surface transparent conductive layer 1250. In one embodiment bias wire 1430 is discrete and in another embodiment bias wire 1430 and the bias wire insulation are integrated with the solar cell. This is analogous to a "through silicon via" (TSV) in some IC chips.

This design may be particularly suitable for fabrication of a crystalline silicon solar cell where the bias circuit 1510 may be fabricated as part of the solar cell. For example a transistor, 1512-1, 1512-2, and 1522, (and/or resistors) and wiring, including bias wire 1430, are fabricated on the back of the solar cell.

The disclosed bias circuit 1500 is engineered to provide a bias that optimizes the output power of the solar cell. For example, this may depend on the solar cell temperature, output current, and output voltage. In one embodiment, the bias circuit has means to measure operating parameters such as: solar cell temperature; solar cell output current; solar cell output voltage; bias current to/from the front surface coating. These measurements may be inputs to an algorithm to provide the optimum bias voltage and the algorithm may be implemented by analog means and/or digital means.

In one embodiment, the bias circuit provides a negative feedback loop that adjusts the bias to optimize the output power. In another embodiment, the bias circuit effectively implements an open-loop algorithm to provide optimum bias. In yet another embodiment, the bias circuit includes an open-loop algorithm to provide an approximate optimum bias plus a feedback loop for fine-tuning to the exact optimum bias.

The disclosed solar cell designs may be self-powering by using energy generated by the solar cell to activate bias. When illuminated by sunlight, the solar cell directly generates electrical power, including voltage and current, which may be used to activate the disclosed bias circuit. The energy generated by the solar cell activates electrical bias on the transparent conductive layer on the front surface of the solar cell. In the embodiment shown in FIG. 1A, there is ohmic contact between the transparent conductive layer and the solar cell—thus some of the generated energy activates a bias voltage and a bias current. In the embodiment shown in FIG. 1B, there is a dielectric inner window layer between the transparent conductive layer and the solar cell. Between these two layers is capacitive coupling but not sustained current coupling—thus some of the generated energy activate a bias voltage comprises an applied voltage with nil sustained current.

Thus, the bias circuit and its power activation source are both within the solar cell assembly and there is not a need for an external connection or external power source to activate the bias circuit—in other words, the bias is self-activated. The electrical energy(ies) generated by the solar cell activates a bias voltage. This is applied to a transparent conductive layer on the front surface of at least one solar cell. This repels minority carriers, and thus reduces surface recombination, and thus improves photo-voltaic efficiency. The solar cell assemblies disclosed may have only two external electrical connections, outputs for emitter and base (shown as 1411 and 1421 respectively). The disclosed solar cell assemblies are substantially compatible with structures and assembly processes for a panel of conventional solar cells.

By contrast, a seperately packaged bypass diode and separate packaged bias circuit may be less compatible with a conventional packaged bypass diode by itself. Further, a solar cell assembly using three external electrical connections may be less compatible with a conventional panel and its assembly processes.

In the embodiment shown in FIG. 1B, the bias voltage is applied to a series circuit including dielectric inner window layer 1240 and the semiconductor material of the solar cell. The dielectric inner window layer 1240 will drop a substantial part of the bias voltage and this reduced remaining voltage will drop across the semiconductor material and contribute to the E-field and decrease the front surface recombination (FSR). To make FSR sufficiently small will require a sufficiently large electrical field in the semiconductor solar cell. A larger bias voltage may be necessary to compensate for this reduction and it may be desirable for the bias voltage to exceed the voltage directly generated by the solar cell. For example, solar cell voltage is typically in the range of 0.5V for a silicon solar cell so a corresponding bias voltage equal to or greater than 0.5V.

In a corresponding embodiment, the bias circuit may step up voltage, from the voltage directly generated by the solar cell, to a larger bias voltage. Means to step up voltage include a DC to DC switched capacitor voltage multiplier. This is well suited to drive the capacitive load formed by the transparent conductive layer, inner window layer, and semiconductor solar cell. This step up circuit may be provided by the IC plus a small auxiliary component(s) such as a small capacitor(s).

FIG. 3A is diagram depicting a panel level embodiment of disclosed subject matter. These designs facilitate a larger bias voltage in spite of a simpler bias circuit within each integrated circuit within each solar cell assembly. This larger bias voltage facilitates less recombination and better photovoltaic efficiency; however this requires a solar panel with less conventional structure and assembly process.

Solar panel 3000 includes plural solar cell assemblies 1000 which are connected in electrical series along panel-level power wires 3100 that provide a moderately large panel-level DC voltage which feeds panel-level converter 3200. Panel-level converter 3200 provides panel-level AC bias wire that feeds a panel-level bias wire 3300 that connects in electrical parallel to every solar cell assembly.

FIG. 3B is a diagram highlighting an integrated circuit embodiment and solar assembly design of FIG. 3A. Each solar cell assembly has three external connections: two are the emitter and base power outputs, shown as wires 1411 and 1421 on the solar cell back surface 1300, and the third is the panel-level bias wire 3300 that feeds AC through input capacitor 1515 into IC 1500. Here the bias circuit, such as a rectifier 1516, rectifies AC to pulsed DC and optionally adjusts its voltage. This pulsed DC feeds bias wire 1430 that feeds the transparent conductive layer 1250 on front surface 1200 of solar cell 1100. The pulsed DC is current-integrated and voltage-smoothed by the capacitive load formed by transparent conductive layer 1250, dielectric inner window 1240, and semiconductor solar cell 1100.

Because the solar cell assemblies are connected in series, they have unequal DC offsets. Panel bias wire 3300 feeds each solar cell assembly 1000 via a coupling capacitor 1515 that provides DC isolation—thus one AC bias voltage can provide DC bias voltages on top of unequal DC offset voltages.

The panel level embodiment has several advantages including: the panel-level converter serves many solar cells so it has a relatively small normalized cost (cost/watt of peak generated power); the panel-level DC provides moderately large voltage and thus facilitates conversion to AC with moderately large voltage, and thus facilitates moderately large voltage DC bias, and thus facilitates maximum PV efficiency; the panel level embodiment allows for an especially simple bias circuit for each solar cell assembly, for example a simple coupling capacitor.

However, the pane level embodiment requires a less conventional panel and assembly process, particularly panel bias wire 3300 and three connections (solar cell emitter wire 1410, solar cell base wire 1420, and panel bias wire 3300) to each solar cell assembly.

Solar cell fabrication and passivation determine the types and densities of recombination centers and traps near the front surface which determine what bias is optimum. Other factors, such as surface effects, various process details, and the average charge density in traps (which may depend on operating parameters, such as solar flux, cell temperature, and load resistance) may also play a part in determining bias.

Thus, it may be difficult to correctly predict the average charge density, optimum bias, and cell efficiency improvement.

One theory suggests that the optimum bias should weakly repel minority carriers. Thus the optimum bias is close to an emitter voltage in an N-type semiconductor. Another theory suggests the optimum bias should counter-balance trapped charges near the front surface. Thus, an optimum bias may be approximately mid-way between the emitter and base. While yet another theory suggests the optimum bias should be midway between the voltage slightly inboard of the base and the voltage slightly inboard of the emitter.

Yet another theory is that as front surface voltage becomes more repulsive to minority carriers, then the recombination will reduce. Thus sufficiently strong repulsion will cause insignificant recombination. This theory encourages bias voltage that is repulsive and large.

Therefore, the optimum bias may be more cleanly initially determined by experiments. For example, use a solar cell with front surface coating plus an adjustable bias source (an adjustable voltage source, or charge source or current source) with a corresponding meter and a system to apply a specified solar flux. Thus measure the curve of cell output current and voltage. Set the test conditions of solar flux and cell temperature. For example, 1,000 w/m^2 and 25 C are the defined standard test conditions, STC. Fix one output parameter, such as load resistance, output voltage, or output current. Then scan the bias voltage and observe the corresponding output power and cell efficiency. This directly measures the bias that provides maximum output power, and the corresponding cell efficiency. Then measure the optimum bias and cell efficiency for each test condition in the relevant range of solar flux and cell temperature.

Next, summarize these measurements by an algorithm that calculates optimum bias as a function of test conditions. Transform this into an algorithm to calculate optimum bias as a function of cell operating parameters (such as cell voltage, cell current, cell temperature. Translate this algorithm into an analog circuit or as a digital circuit with analog output as either may be used to guide the bias circuit.

Another method to measure the optimum bias follows. For each bias level, measure the curve of cell voltage and current and calculate the maximum output power. After this is done for each bias level, plot the maximum output power versus bias level. Thus, directly measure the bias level that achieves the maximum output power. By doing this under various test conditions, measure the optimum versus test conditions.

DLTS (Deep Level Transient Spectroscopy) methods are often used to measure traps and charges in or near a semiconductor junction between two terminals. This may be applied between the front surface transparent conductive layer and either the emitter or base contact. DLTS is a transient method and if and only if there is significant resistance or capacitance, the resulting slow time constants would obscure transient effects. Therefore, use a solar cell with very small area, possibly a fragment of a normal solar cell. Direct measurement of optimum bias and DLTS measurements may be used together to guide construction of a theory to describe trapped charges and front side bias effects.

A front surface optimum bias enables output power with higher efficiency compared to a similar solar cell without a front surface optimum bias. In the latter case, suppose that near the front surface there are recombination centers, traps, and unbalanced net trapped charge that attract minority carriers. Therefore some E-field lines extend from these unbalanced charges to an electrode on the back surface.

Some photo-generated minority carriers will drift along this field-line towards the front surface unbalanced charges and recombination centers where the carrier energy will be wasted.

Suppose there are traps in a solar cell near the front surface whose average charge varies with solar flux and temperature. The bias circuit may be engineered to counter-balance the variable charge traps across a range of solar flux and temperature.

Further, compare a cell with an optimized bias with a solar cell that has additional fixed charges, with the opposite polarity, but does NOT have an optimized bias. At a specific solar flux and temperature, these variable traps may be counter-balanced by the fixed charges. However, as the solar flux and temperature change, the variable trapped charges will change which will create a corresponding un-balance between the fixed charges and the variable charge traps. This provides a net charge that will degrade power collection from photo-excited holes and electrons. Thus, the optimized front surface bias provided herein is an improvement over using a fixed charge to counter-balance traps with temperature-dependent average charge.

What is claimed is:

1. A photovoltaic solar cell assembly for generating electrical energy from light, said solar cell assembly comprising:
   a front surface electrical bias circuit activated by electrical energy generated by said solar cell assembly;
   a bypass circuit connected to said front surface electrical bias circuit;
   a transparent conductive layer positioned near or directly on a light receiving front surface of said solar cell; and
   a bias wire activated by at least one electrode on said solar cell, said electrode providing some of said electrical energy to said front surface electrical bias circuit, said bias wire transferring said electrical energy to said transparent conductive layer to activate a front surface electrical bias, wherein said front surface bias circuit comprises at least a voltage divider formed by at least two resistors.

2. The photovoltaic solar cell assembly of claim 1, wherein said front surface electrical bias circuit and said electrode have approximately equivalent voltages.

3. The photovoltaic solar cell assembly of claim 1, wherein said front surface electrical bias circuit is directly connected to said electrode, said electrode having the same polarity as minority carriers in the solar cell.

4. The photovoltaic solar cell assembly of claim 1, wherein said front surface electrical bias circuit further comprises a control, said control optimizing front surface bias to reduce the concentration of minority carriers near the front surface of the solar cell.

5. The photovoltaic solar cell assembly of claim 1, wherein said front surface electrical bias circuit further comprises a control, said control responsive to operating conditions of said solar cell.

6. The photovoltaic solar cell assembly of claim 1 wherein said bypass circuit is at least partially unified with said front surface electrical bias circuit.

7. The photovoltaic solar cell assembly of claim 1, wherein said bypass circuit comprises at least a bypass diode.

* * * * *